(12) United States Patent
Sun et al.

(10) Patent No.: US 6,946,908 B1
(45) Date of Patent: Sep. 20, 2005

(54) PROGRAMMABLE RADIO FREQUENCY PREDISTORTION LINEARIZER AND METHOD THEREOF

(75) Inventors: Jia Sun, Calgary (CA); Michael Yan Wah Chia, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 10/344,289

(22) PCT Filed: Aug. 11, 2000

(86) PCT No.: PCT/SG00/00116

§ 371 (c)(1),
(2), (4) Date: Jul. 10, 2003

(87) PCT Pub. No.: WO02/15391

PCT Pub. Date: Feb. 21, 2002

(51) Int. Cl.[7] .................................................. H03F 1/26
(52) U.S. Cl. ....................................... 330/149; 330/283
(58) Field of Search ............................ 330/2, 149, 283, 330/302, 305

(56) References Cited

U.S. PATENT DOCUMENTS 6,111,477 A  *  8/2000  Klymyshyn et al. ......... 333/139
6,724,253 B2 *  4/2004  Hau et al. .................... 330/149

* cited by examiner

*Primary Examiner*—Steven J. Mottola
(74) *Attorney, Agent, or Firm*—Lawrence Y. D. Ho & Associates

(57) ABSTRACT

A radio frequency (RF) predistortion linearizer with a transistor and a control circuit, an input matching circuit and an output matching circuit. The control circuit is electrically coupled to a control voltage source that supplies control voltages via a control node. A resistor and a coupling inductor electrically couples the control circuit to the control node to receive the control voltages. These control voltages set two varactors of the control circuit to provide a capacitance. The capacitance and an inductance provided by an inductive block of the control circuit can thus provide a resonant frequency. This resonant frequency is thus controllable and is based on a centre frequency of an RF input signal provided to an input node of the RF predistortion linearizer.

8 Claims, 5 Drawing Sheets

PROGRAMMABLE RADIO FREQUENCY PREDISTORTION LINEARIZER AND METHOD THEREOF

FIELD OF THE INVENTION

This invention relates to radio frequency (RF) power amplifiers and, in particular, to linearizing performance of RF power amplifiers in terms of efficiency and distortion.

BACKGROUND

Conventionally, radio frequency (RF) power amplifiers are used to amplify signals in wireless communication devices such as two-way radios, mobile telephones and satellite transceivers. In the wireless communication devices, batteries typically provide electrical power. Such batteries have limited energy storage capacity. Therefore, reducing power consumption helps to increase an operating period of a wireless communication device as electrical power from batteries is expended less quickly with improved efficiency.

Generally, electrical power in wireless communication devices is consumed mainly by RF power amplifiers. Therefore, improving efficiency of these amplifiers helps to reduce power consumption, for example, in base stations of a wireless communication system and increasing the operating period of handsets communicating with the base stations.

In addition to power consumption, another important parameter that characterises an RF power amplifier is the linearity. Linearity of an RF amplifier is affected by the output of the RF power amplifier. Typically, RF power amplifiers are biased to operate in a saturation mode in order to achieve high efficiency. In the saturation mode, RF power amplifiers typically do not operate as linearly as desired. Consequently, non-linear amplification of an input signal by an RF power amplifier biased to operate in the saturation mode is known to cause signal distortion. Generally, such signal distortion causes negative amplitude and positive phase deviation as RF input signal power increases. Such signal distortion includes what is commonly referred to as intermodulation (IM) distortion as well as harmonic distortion that affect desired signals of a wireless communication device. Furthermore, IM distortion generates undesired signals that interfere with reception or transmission of desired signals of other wireless communication devices.

Linearity problems of an RF amplifier can be alleviated using linearization schemes such as feedback systems and feedforward systems. However, feedback linearization schemes tend to resolve only a narrow bandwidth of RF input signals and therefore cannot efficiently linearize RF amplifiers operating over broader bandwidths. In addition, such linearization schemes typically degrade in performance at margin frequencies of an operation bandwidth compared to frequencies that are nearer to the centre of the operation bandwidth. Furthermore, the feedforward linearization schemes are complicated to implement, as an amplifier's transfer characteristics have to be accurately determined and this requires additional circuitry with more components. Accommodating these additional components is a problem because space is limited in wireless communication devices. Furthermore, controlling the magnitude and phase to cancel or at least reduce signal distortion is not easy.

Another linearization scheme alleviates signal distortion by predistorting a signal such that the signal is complementarily compensated when subjected to non-linear amplification by an RF amplifier. This linearization scheme is known as predistortion and circuitry that effects the predistortion is commonly referred to as a predistortion linearizer. An RF input signal is predistorted by the predistortion linearizer to complement distortion characteristics of the RF power amplifier prior to amplifying by that RF power amplifier. Predistortion linearizers using, for example, diode or GaAs field-effect-transistors (FETs) only predistort an RF input signal at a specific level of input power at the operation frequency of the RF input signal. As such, predistortion linearizers have limited applicability in RF amplifiers that are operable across the entire input power dynamic range in wide bandwidth applications.

Therefore, in view of the above limitations in linearization schemes and circuits, what is needed is a predistortion linearizer to enable an RF amplifier to operate more linearly and with better efficiency across the entire input power dynamic range in wide bandwidth applications.

SUMMARY

In accordance with one aspect of the invention, there is disclosed a radio frequency (RF) predistortion linearizer for predistorting an RF input signal, the RF predistortion linearizer including:
a transistor having an input electrode for receiving the RF input signal, a control electrode and an output electrode;
and
a control circuit having:
at least one inductor having a first node connected to a reference potential and a second node;
and
at least one varactor electrically connected between the second node and the control electrode.

Generally, the control circuit can further include means for electrically coupling the at least one varactor to the control electrode.

Optionally, the control circuit can further include means for electrically coupling the at least one varactor to a control voltage source.

Generally, the control circuit can further include means for compensating inductance of the at least one inductor.

Optionally, the control circuit can further include means for improving stability of the transistor.

Generally, the RF predistortion linearizer can further include means for matching impedance of the input electrode to other circuitry providing the RF input signal.

Optionally, the RF predistortion linearizer can further include means for matching impedance of the output electrode to other circuitry for receiving a predistorted RF output signal, the predistorted RF output signal being produced by the RF predistortion linearizer.

Generally, the RF predistortion linearizer can further include means for matching impedance of the output electrode to an input for receiving the RF input signal after amplification by the transistor.

Optionally, the transistor can be a bipolar junction transistor.

In accordance with another aspect of the invention, there is disclosed a method for predistorting a radio frequency (RF) input signal, the method including the steps of:
determining an operation frequency of the RF input signal;
generating at least one control voltage and at least one bias voltage associated with the operation frequency;

providing an RF predistortion linearizer having a transistor and a control circuit electrically coupled to the transistor, the transistor having an input electrode for receiving the RF input signal and the at least one bias voltage, a control electrode for receiving control signals from the control circuit and an output electrode;

setting at least one varactor of the control circuit with the at least one control voltage, the at least one varactor being electrically connected to the control electrode; and controlling the transistor to operate at the operation frequency using a capacitance, the capacitance being derived from the at least one varactor with the at least one control voltage.

Preferably, the generating step can include the step of determining a value for the at least one control voltage.

Optionally, the determining step can include the step of retrieving the value from a storage location.

BRIEF DESCRIPTION OF THE DRAWINGS

A preferred embodiment of the invention is described hereinafter with reference to the drawings, in which.

DETAILED DESCRIPTION

A predistortion linearizer and a method for predistorting a radio frequency input signal in accordance with a preferred embodiment of the invention are described. In the following, numerous details are provided for a more thorough description. It shall be apparent to one skilled in the art, however, that the invention may be practised without such details. In other instances, well-known details have not been described at length so as not to obscure the invention.

The advantages of the preferred embodiment of the invention are manifold. One advantage of the preferred embodiment of the invention is that compensating distortion in RF amplifiers can be optimised for different input power levels and at different operating frequencies. Consequently, the predistortion linearizer of the preferred embodiment can be applied to RF amplifiers for wide band applications.

Another advantage of the preferred embodiment of the invention is that controlling parameters of RF amplifiers can be calibrated for the different input power and the different operating frequencies. Upon calibration, values associated with such controlling parameters are stored for retrieval when compensating signal distortion of RF amplifiers.

Yet another advantage of the preferred embodiment of the invention is that gain and phase compensation can be easier controlled with increasing input power and across the entire band of operating frequencies compared with existing predistortion linearizers.

Still another advantage of the preferred embodiment of the invention is that the predistortion linearizer has low power consumption and a simple architecture compared with feedforward linearization schemes.

Figure 1:
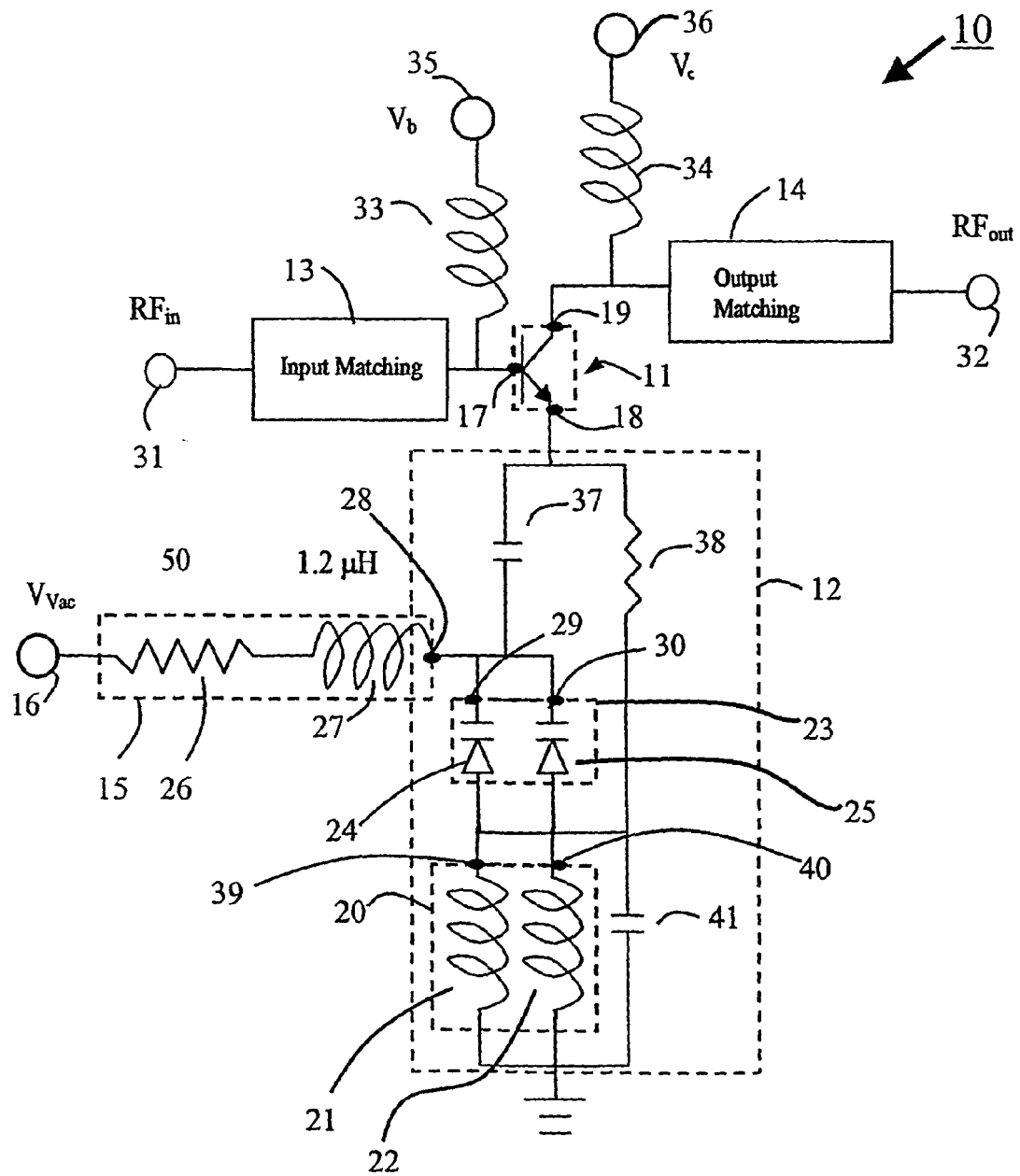
FIG. 1 is a schematic block diagram illustrating a radio frequency (RF) predistortion linearizer in accordance with a preferred embodiment of the invention.

Referring now to FIG. 1, a schematic block diagram illustrating a radio frequency (RF) predistortion linearizer 10 in accordance with a preferred embodiment of the invention is illustrated. The RF predistortion linearizer 10 includes a transistor 11 and a control circuit 12. The transistor 11 can be, for example, a bipolar junction transistor for radio frequency (RF) predistortion applications. The RF predistortion linearizer 10 further includes an input matching circuit 13, an output matching circuit 14 and a coupling circuit 15 for electrically coupling the control circuit 12 to a control voltage source (not shown). The control voltage source supplies control voltages via a control node 16.

The transistor 11 has an input electrode 17 for receiving an RF input signal and with which to bias the transistor 11. A control electrode 18 couples the transistor 11 to the coupling circuit 12. Signal output from the transistor 11 is provided at an output electrode 19 with which to bias the transistor 11. The control circuit 12 has an inductive block 20 with two inductors 21,22 and a capacitive block 23 with two varactors 24,25. The coupling circuit 15 for electrically coupling the control circuit 12 to the control voltage source includes a resistor 26 and a coupling inductor 27. An electrode 28 of the coupling inductor 27 electrically connects to respective cathodes 29,30 of the two varactors 24,25. However, positions of the resistor 26 and the coupling inductor 27 can be interchanged such that the resistor 26 electrically connects to the cathodes 29,30 instead of the coupling inductor 27.

The control voltage source provides a control voltage via control node 16 to bias the two varactors 24,25. Based on the control voltage, a capacitance is derived from the two varactors 24,25. This capacitance and the inductance of the inductor block 20 enables the control circuit 12, together with the transistor 11, to provide an overall inductive impedance. The overall inductive impedance enables a non-linear compensation effect on RF input signal such that positive amplitude and negative phase deviation results as the RF input signal power increases.

The input matching circuit 13 and the output matching circuit 14 provide, respectively, impedance matching between the input electrode 17 and the output electrode 19 of the transistor 11 to other circuitry (not shown). Such other circuitry can be, in a transmitter system, an RF amplifier circuit to receive a predistorted RF output signal produced by the RF predistortion linearizer 10. The predistorted RF output signal is provided to the RF amplifier circuit via an output node 32 of the output matching circuit 14. In the other words, the predistorted RF output signal serves as an input to the RF amplifier circuit. Such an RF amplifier circuit has distortion characteristics that complement the predistorted RF output signal to thereby provide a more linear amplified RF signal after amplifying the predistorted RF output signal.

The input electrode 17 of the transistor 11 is biased by a direct current (DC) bias voltage source $V_b$ via a base inductor 33. The output electrode 19 connects to a DC supply voltage source $V_c$ via a collector inductor 34. The base inductor 33 and the collector inductor 34 also filter out alternating current (AC) components from DC voltages provided via bias nodes 35, 36 respectively associated with voltage sources $V_b$ and $V_c$.

The control electrode 18 of the transistor 11 is electrically connected to a blocking capacitor 37 and a resistor 38 of the control circuit 12. The blocking capacitor 37 connects at an opposite node to the cathodes 29,30 of the two varactors 24,25 to block off DC components from the control voltage source. The resistor 38 connects at an opposite node to respective anodes 39,40 of the two varactors 24,25. In addition, the resistor 38 improves stability of the transistor 11 as well as enables easier control of gain and phase compensation of the transistor 11. A compensating capacitor 41 is connected in parallel with the inductive block 20 to compensate the inductance from the two inductors 21,22 for the entire range of impedance requirement. The compensating capacitor 41 and the resistor 38 share a common node.

Figure 2:
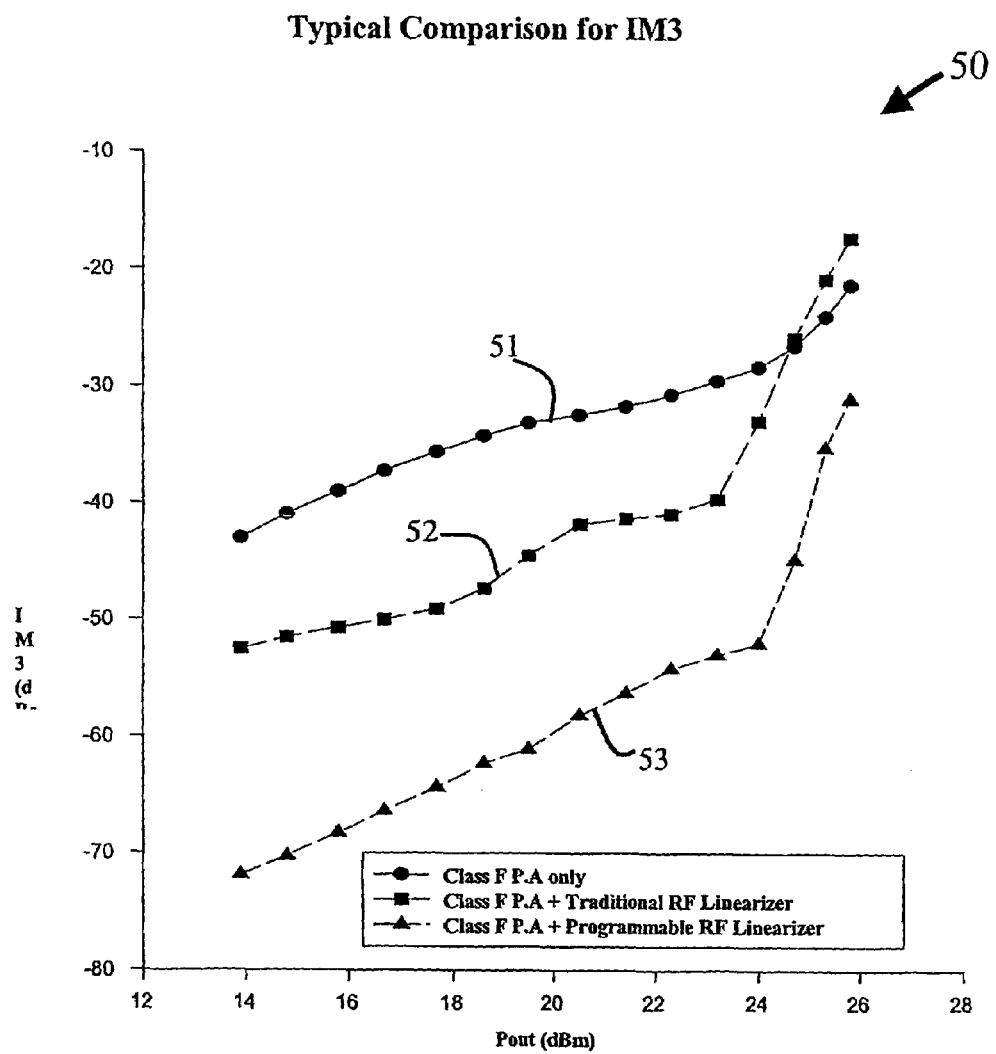
FIG. 2 is a graph comparing typical intermodulation performance of different power amplifiers with and without the RF predistortion linearizer of FIG. 1.

A graph 50 comparing typical intermodulation performance of different RF power amplifiers with and without the predistortion linearizer 10 is illustrated in FIG. 2. A first plot 51 in FIG. 2 shows performance of a Class F amplifier without application of any linearizing scheme. A Class F amplifier applied with a conventional linearizing scheme is shown with a second plot 52. A third plot 53 shows a Class F amplifier electrically coupled with the RF predistortion linearizer 10. As can be seen from this graph, the performance shows best intermodulation performance when the Class F amplifier is coupled to the RF predistortion linearizer 10. In particular, the third plot 53 of about 20 dBc over the whole input power dynamic range.

Figure 3:
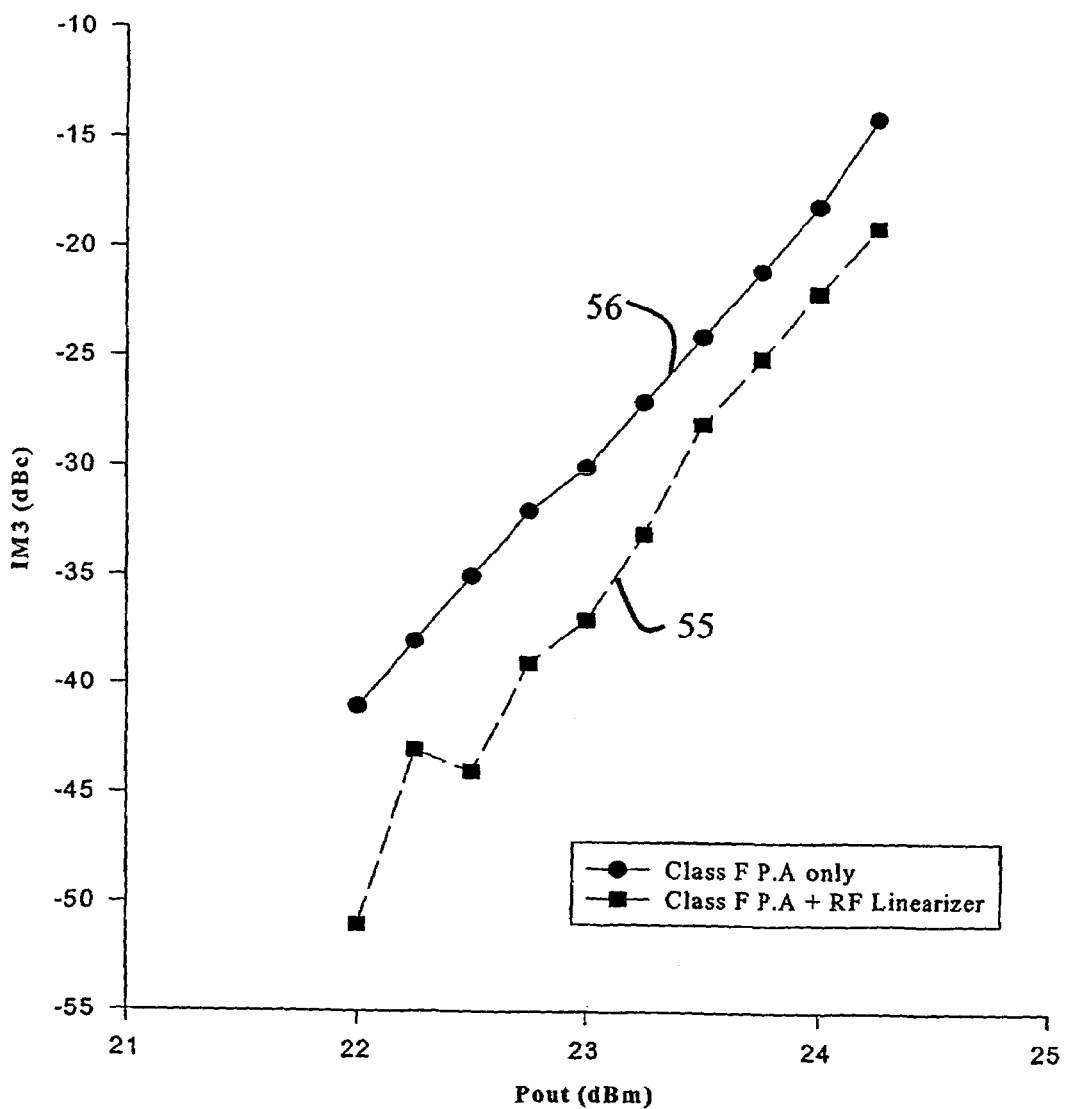
FIG. 3 is a graph comparing actual intermodulation performance of different power amplifiers with and without the RF predistortion linearizer of FIG. 1.

A first plot 55 in FIG. 3 shows intermodulation test performance of the RF predistortion linearizer 10 when applied to a Class F amplifier at an operation frequency of, for example, 1.885 gigaHertz (GHz). The first plot is graphed against a second plot 56 of the Class F amplifier without application of the RF predistortion linearizer 10.

Figure 4:
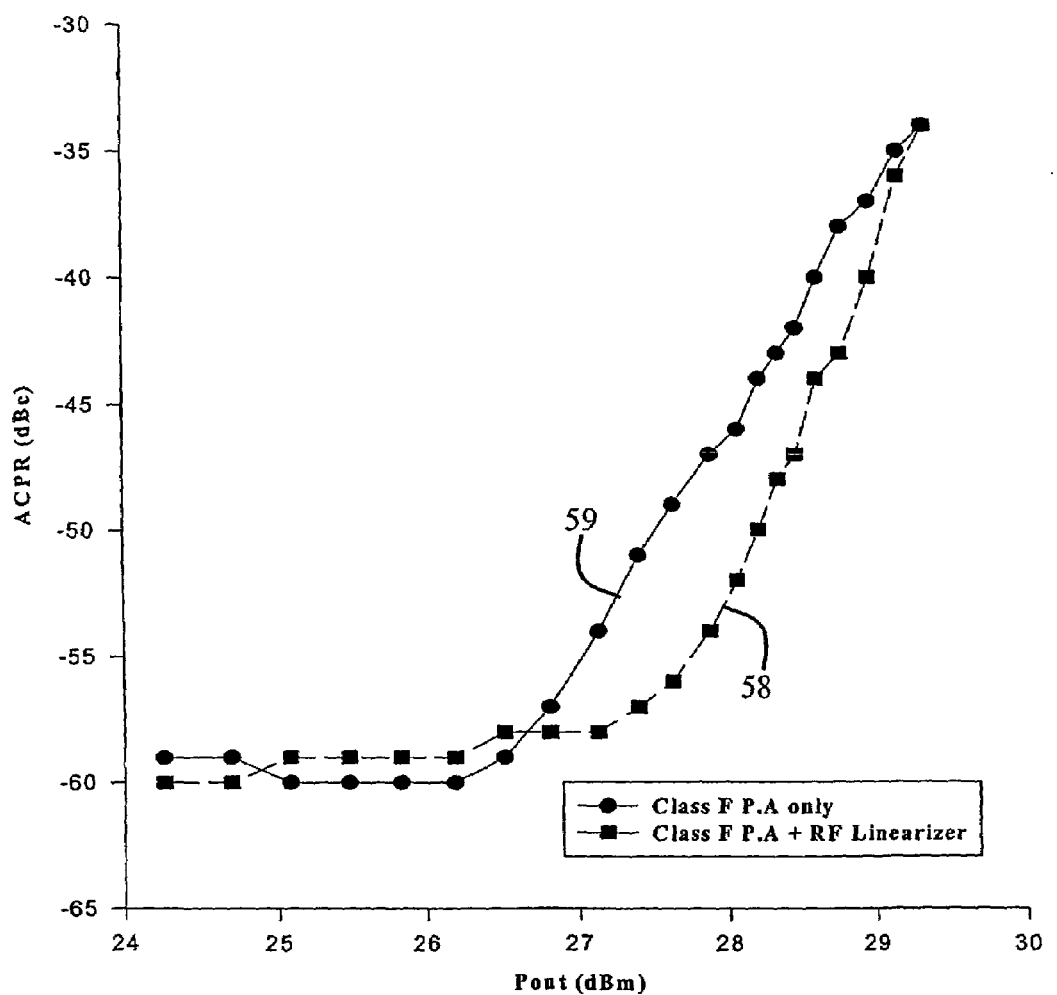
FIG. 4 is a graph comparing adjacent channel power rejection of power amplifiers with and without the RF predistortion linearizer of FIG. 1.

FIG. 4 shows adjacent channel power rejection test performance of the RF predistortion linearizer 10 when applied to a Class F amplifier at an operation frequency of, for example, 1.885 gigaHertz (GHz). A first plot 58 graphs results of the RF predistortion linearizer 10 when applied to the Class F amplifier. A second plot 59 of the Class F amplifier without application of the RF predistortion linearizer 10 is graphed against the first plot 58.

Test data of a prototype are illustrated in FIG. 3 and FIG. 4. As shown in FIG. 3 and FIG. 4, there is about 9 dBc improvement in the third order intermodulation (IM3) and about 6 dBc improvement in adjacent channel power rejection (ACPR).

Figure 5:
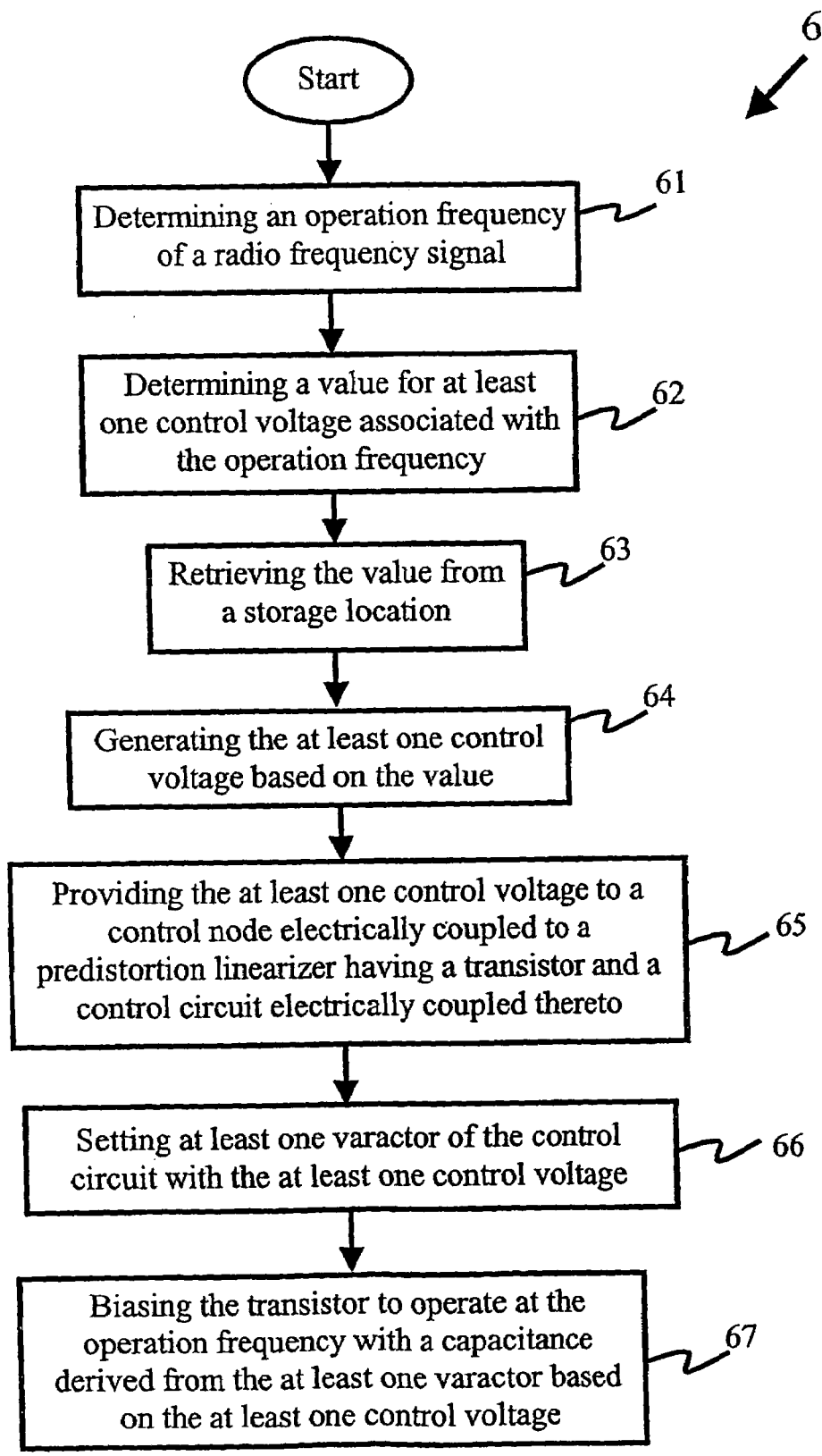
FIG. 5 is flowchart illustrating a method for predistorting an RF input signal using the RF predistortion linearizer of FIG. 1.

Referring now to FIG. 5, a flowchart illustrates a method 60 for predistorting an RF input signal using the RF predistortion linearizer 10. The method begins at step 61 in which an operation frequency of the RF input signal is determined by a baseband processor (not shown) such as, for example, a digital signal processor. Such processors typically reside in wireless communication devices such as two-way radios, mobile telephones and satellite transceivers. Thereafter, a value for at least one control voltage associated with the operation frequency is determined at step 62. The value is then retrieved from a storage location at step 63. Method 60 then proceeds to step 64 in which the at least one control voltage is generated based on the value. With the at least one control voltage generated, the processor provides the at least one control voltage to the control node 16 of the RF predistortion linearizer 10 at step 65.

Receiving the at least one control voltage at the cathodes 29,30, the varactors 24,25 are thus set with the at least one control voltage at step 66. In setting the varactors 24,25 with the at least one control voltage, a capacitance is derived from the varactors 24,25 based on the at least one control voltage. With this capacitance, the transistor 11 is biased at step 67 to operate at the operation frequency of the RF input signal.

In the foregoing description, a predistortion linearizer and a method for predistorting a radio frequency input signal are described. Although the preferred embodiment is described, it shall be apparent to one skilled in the art in view of this preferred embodiment that numerous changes and/or modifications can be made without departing from the scope and spirit of the invention.

What is claimed is:

1. A radio frequency (RF) predistortion linearizer for predistorting an RF input signal, said RF predistortion linearizer including:
   a transistor having an input electrode for receiving said RF input signal, a control electrode and an output electrode; and
   a control circuit having:
      at least one inductor having a first node connected to a reference potential and a second node; and
      at least one varactor electrically connected between said second node and said control electrode;
         said control circuit further includes means for compensating inductance of said at least one inductor.

2. The RF predistortion linearizer as claimed in claim 1, wherein said control circuit further includes means for electrically coupling said at least one varactor to a control voltage source.

3. The RF predistortion linearizer as claimed in claim 1, wherein said control circuit further includes means for improving stability of said transistor.

4. The RF predistortion linearizer as claimed in claim 1, and further including means for matching impedance of said input electrode to other circuitry providing said RF input signal.

5. The RF predistortion linearizer as claimed in claim 1, and further including means for matching impedance of said output electrode to other circuitry for receiving a predistorted RF output signal, said predistorted RF output signal being produced by said RF predistortion linearizer.

6. The RF predistortion linearizer as claimed in claim 1, and further including means for matching impedance of said output electrode to an input for receiving said RF input signal after amplification by said transistor.

7. A method for predistorting a radio frequency (RF) input signal, said method including the steps of:
   determining an operation frequency of said RF input signal;
   generating at least one control voltage and at least one bias voltage associated with said operation frequency;
   providing an RF predistortion linearizer having a transistor and a control circuit electrically coupled to said transistor, said transistor having an input electrode for receiving said RP input signal and said at least one bias voltage, a control electrode for receiving control signals from said control circuit and an output electrode;
   setting at least one varactor of said control circuit with said at least one control voltage, said at least one varactor being electrically connected to said control electrode; and
   controlling said transistor to operate at said operation frequency using a capacitance, said capacitance being derived from said at least one varactor with said at least one control voltage,
   wherein said step of determining a value for said at least one control voltage includes the step of retrieving said value from a storage location.

8. The method as claimed in claim 7, wherein said generating step includes the step of determining a value for said at least one control voltage.

* * * * *